US006664865B2

United States Patent
Groe et al.

(10) Patent No.: US 6,664,865 B2
(45) Date of Patent: Dec. 16, 2003

(54) AMPLITUDE-ADJUSTABLE OSCILLATOR

(75) Inventors: John Groe, Poway, CA (US); Joseph Austin, San Diego, CA (US)

(73) Assignee: Sequoia Communications, San Diego, CA (US)

( * ) Notice: Subject to any disclaimer, the term of this patent is extended or adjusted under 35 U.S.C. 154(b) by 0 days.

(21) Appl. No.: 10/142,733

(22) Filed: May 10, 2002

(65) Prior Publication Data

US 2003/0001685 A1 Jan. 2, 2003

Related U.S. Application Data

(60) Provisional application No. 60/290,379, filed on May 11, 2001.

(51) Int. Cl.[7] .............................................. H03B 1/00
(52) U.S. Cl. ....................................... 331/183; 331/185
(58) Field of Search ............................... 331/185, 182, 331/183, 186, 109

(56) References Cited

U.S. PATENT DOCUMENTS

| 5,331,292 A | * | 7/1994 | Worden et al. | 331/1 A |
|---|---|---|---|---|
| 5,561,385 A | * | 10/1996 | Choi | 327/536 |
| 5,581,216 A | * | 12/1996 | Ruetz | 331/57 |
| 5,767,748 A | * | 6/1998 | Nakao | 331/57 |
| 6,052,035 A | * | 4/2000 | Nolan et al. | 331/74 |
| 6,091,307 A | * | 7/2000 | Nelson | 331/109 |
| 6,191,956 B1 | * | 2/2001 | Foreman | 363/16 |
| 6,404,252 B1 | * | 6/2002 | Wilsch | 327/198 |

* cited by examiner

Primary Examiner—Timothy P. Callahan
Assistant Examiner—Cassandra Cox

(57) ABSTRACT

Amplitude-adjustable oscillator. The oscillator includes a feedback loop to control the amplitude of an oscillator output signal. The feedback loop includes a pair of clamping transistors, wherein base terminals of the clamping transistors are coupled to an adjustable voltage signal to prevent saturation of the oscillator circuit. The feedback loop also includes a filter to monitor the current flowing through the clamping transistors. The feedback loop also includes an amplifier to compare an output of the clamping transistors to a reference signal, and a reference generator to set an operating bias for the oscillator.

9 Claims, 2 Drawing Sheets

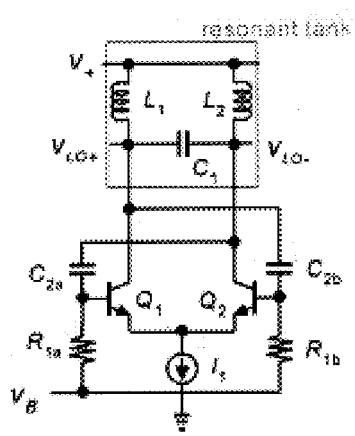
Figure 1
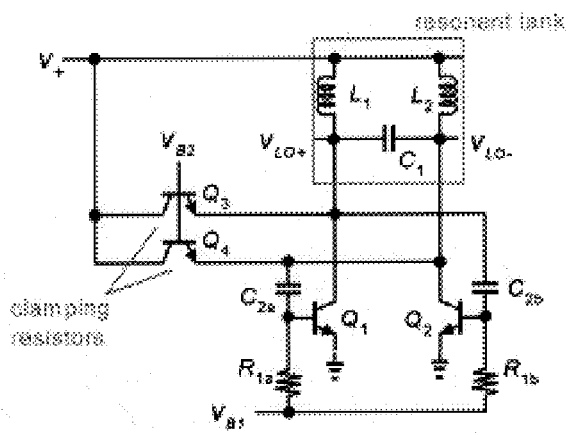
Figure 2
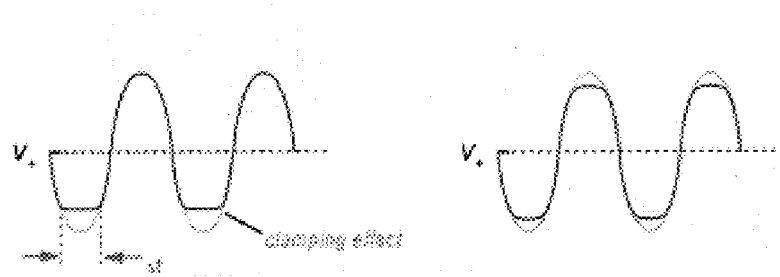
Figure 3a
Figure 3b

AMPLITUDE-ADJUSTABLE OSCILLATOR

CROSS REFERENCE TO RELATED APPLICATIONS

This Application claims the benefit of priority of a pending U.S. Provisional Patent Application entitled "AMPLITUDE-ADJUSTABLE OSCILLATOR" Serial No. 60/290,379 filed on May 11, 2001, the disclosure of which is incorporated herein in its entirety for all purposes.

FIELD OF THE INVENTION

The present invention relates generally to oscillators used in communication transceivers, and more particularly, to direct-coupled differential oscillators.

BACKGROUND OF THE INVENTION

A communication transceiver utilizes locally generated oscillator signals to frequency translate modulated message signals. Ideally, the oscillator signals are single-frequency, sinusoidal signals without any jitter or noise. Furthermore, these oscillator signals are generally controlled by phase-locked loops and are designed to span the range of communication channels.

In practice, the oscillator signal contains noise. The noise affects receiver systems by shifting nearby interfering signals to the same spectrum as the wanted signal. It also degrades transmitter systems by lowering the signal-to-noise ratio and modulation accuracy of the message signal.

In its simplest form, an oscillator consists of a resonant circuit with positive feedback. The resonator sets the frequency of the output signal and shapes the noise produced by the oscillator, as shown by:

$$S_\theta(\Delta\omega) = \frac{FkT}{P_s}\left[1 + \frac{\Delta\omega}{(2Q\omega)^2}\right]$$

where $S_\theta(\Delta\omega)$ is the oscillator phase noise at an offset frequency $\Delta\omega$, F is a noise scaling factor, k is Boltzman's constant, T is temperature, $P_s$ is the carrier signal power, Q is the resonator's quality factor, and $\omega$ is the frequency of the carrier signal.

Lower phase noise can be obtained by improving circuit topologies and increasing DC power, which lowers the noise-scaling factor (F) and increases the amplitude of the oscillator's output signal. These factors are generally limited by operating voltage and device technology. Thus, it would be desirable to have a way to control the amplitude of the oscillator's output without the above-described limitations.

SUMMARY OF THE INVENTION

The present invention includes an oscillator circuit with feedback to accurately control the circuit's output amplitude. The oscillator circuit minimizes phase noise by enabling high amplitude levels without device saturation or breakdown. The feedback loop controls the oscillator's output amplitude and thereby simplifies system and circuit design. Amplitude control of the oscillator's output signal provides several advantages. It prevents transistor saturation and breakdown, enables optimization of mixer signal levels, accurately sets the output level in direct synthesis transmitters, and allows lower power consumption in adaptive receivers operating in strong signal environments.

In one embodiment of the present invention, a high-swing oscillator is provided. The oscillator comprises a resonator circuit and a pair of transistors coupled to the resonator circuit, the transistor pair having collector terminals coupled to a power supply and base terminals selectively biased to prevent saturation or breakdown.

In another embodiment included in the present invention, a feedback loop is provided for use with a differential direct-coupled oscillator circuit to control the amplitude of an oscillator output signal. The feedback loop includes a pair of clamping transistors, wherein base terminals of the clamping transistors are coupled to an adjustable voltage signal to prevent saturation of the oscillator circuit. The loop also includes a filter to monitor the current flowing through the clamping transistors. The loop also includes an amplifier to compare an output of the clamping transistors to a reference signal, and a reference generator to set an operating bias for the direct-coupled oscillator.

In another embodiment included in the present invention, a method is provided for controlling the output amplitude of a differential direct-coupled oscillator. The method comprises the steps of clamping a low peak of an output signal of the oscillator, monitoring a clamping current, converting the clamping current to a filtered voltage, comparing the filtered voltage to a reference voltage to produce a difference voltage, and setting a bias current in the oscillator using the difference voltage.

BRIEF DESCRIPTION OF THE DRAWINGS

The forgoing aspects and the attendant advantages of this invention will become more readily apparent by reference to the following detailed description when taken in conjunction with the accompanying drawings wherein:

FIG. 1 shows a diagram of a direct-coupled differential oscillator;

FIG. 2 shows a diagram of an improved oscillator, capable of high amplitude levels, in accordance with the present invention;

FIGS. 3a–b illustrate the asymmetric output waveform of the high-swing oscillator due to clamping at the low peaks of the output signal for single-ended and differential signals;

DETAILED DESCRIPTION

A direct-coupled oscillator—a widely used topology for integrated circuits—is shown in FIG. 1. Inductors $L_1$ and $L_2$ along with capacitor $C_1$ form a resonant circuit. Capacitors $C_2$ and resistors $R_1$ provide positive feedback to transistors $Q_1$ and $Q_2$, which replenish energy lost in the resonant circuit due to non-ideal reactive elements. Bias current source $I_1$ provides the operating current for transistors $Q_1$ and $Q_2$.

The amplitude of the output signal is limited (by bias current source $I_1$) to protect transistors $Q_1$ and $Q_2$. Otherwise, the base-collector pn junction of these transistors will break down at high reverse-bias levels and will forward-bias at positive voltages.

The voltage at the base of transistors $Q_1$ and $Q_2$ is given by $$V_B \geq V_{BE} + V_{sat}$$

where $V_{BE}$ is the base-emitter voltage of transistors $Q_1$ and $Q_2$, and $V_{sat}$ is the voltage—typically 1 volt or more—needed to prevent saturation of the bias current source.

FIG. 2 shows a high swing oscillator circuit that results from eliminating the bias current source in the direct-coupled oscillator to increase the available output amplitude of the direct-coupled oscillator by as much as 2 volts. The resulting high-swing oscillator requires a precision bias voltage source ($V_{B1}$) at the bases of transistors $Q_1$ and $Q_2$ to regulate operating current.

Transistors $Q_1$ and $Q_2$ sink current through the resonator circuit to replenish energy lost due to non-ideal reactive elements. Ideally, this current is just enough to sustain the amplitude of the oscillation at an operational level. If the sustaining current is slightly higher than required, the oscillator may runaway, producing an increasingly larger output signal. Eventually, the base-collector junction will saturate or breakdown.

Clamping transistors $Q_3$ and $Q_4$ prevent breakdown and runaway in the high-swing direct-coupled oscillator by setting the minimum voltage allowed at the collectors of transistors $Q_1$ and $Q_2$ ($V_{C-min}$) to:

$$V_{C(min)} = V_{B2} - V_{BE}$$

where $V_{B2}$ is the bias voltage source connected to the clamping transistors and $V_{BE}$ is the base-emitter voltage of transistors $Q_3$ and $Q_4$. If the minimum collector voltage is reached, the sustaining current is redirected through the clamping transistors instead of the resonator circuit. This tends to flatten the lower peak of the output signal, creating the asymmetric waveforms shown in FIGS. 3a–b.

Redirecting the sustaining current through the clamping transistors loads the resonator and lowers the phase noise performance of the oscillator. The impact is directly related to the amount of time the clamping transistors are active.

Figure 4:
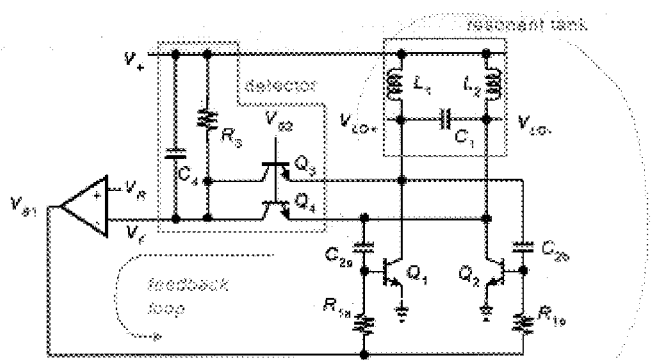
FIG. 4 shows a simplified diagram of an improved oscillator with adjustable amplitude set by feedback in accordance with the present invention.

FIG. 4 shows a feedback loop that adjusts the bias voltage applied to transistors $Q_1$ and $Q_2$, and thus the sustaining current of the resonator circuit. Resistor $R_3$ converts the clamping current to a voltage while capacitor $C_4$ provides filtering. The result ($V_F$) is compared to a reference voltage source ($V_R$) and an error signal is formed. This error signal is then used to correct the bias voltage ($V_{B1}$) applied to transistors $Q_1$ and $Q_2$.

Figure 5:
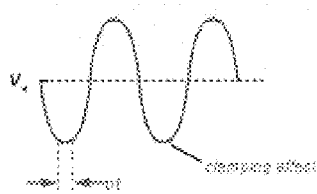
FIG. 5 illustrates the output waveform of the amplitude-adjustable oscillator of FIG. 4.

The reference voltage ($V_R$) is typically set to 25–50 mV. This allows the amplitude of the output signal to grow, and thereby gradually forward bias the clamping transistors at the lower peak of the output waveform, and thus preserve its phase noise characteristics. The resulting output waveform becomes symmetric as FIG. 5 illustrates.

The bias voltage source ($V_{B2}$) applied to the bases of clamping transistors $Q_3$ and $Q_4$ can be used to adjust and control the amplitude of the output signal. This is possible because the feedback loop directs the bias voltage $V_{B1}$ applied to transistors $Q_1$ and $Q_2$ to provide the appropriate sustaining current, scaling this current to the oscillator's output amplitude.

Figure 6:
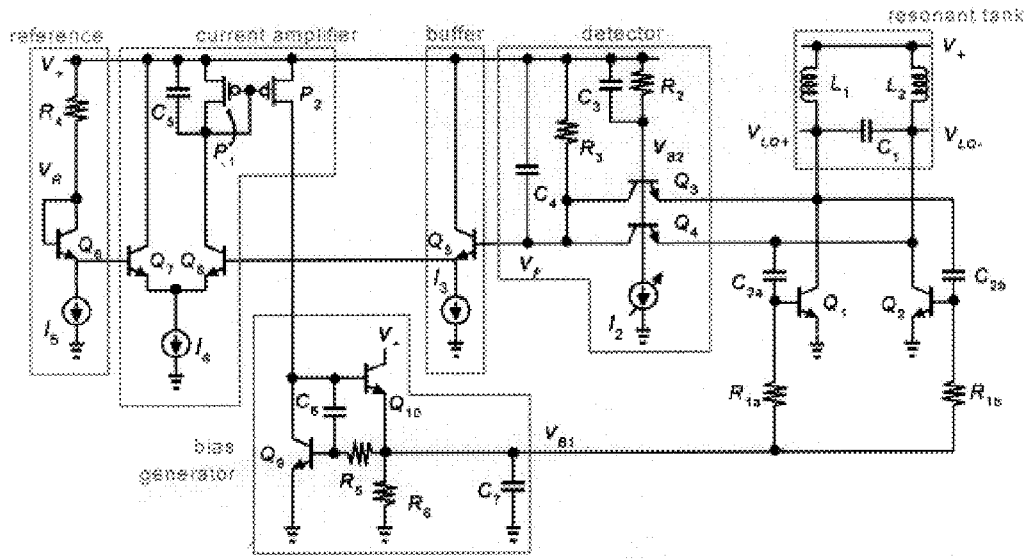
FIG. 6 shows a detailed schematic of one embodiment of an amplitude-adjustable oscillator constructed in accordance with the present invention.

FIG. 6 shows a detailed view of one embodiment of an oscillator with amplitude control according to the present invention. The bias voltage ($V_{B2}$) is easily set by adjustable bias current source $I_2$ and resistor $R_2$, with $V_{B2} = V_+ - I_2 R_2$. The clamping current that flows through transistors $Q_3$ and $Q_4$ produces a filtered voltage ($V_F$) that is buffered by an emitter follower buffer formed by transistor $Q_5$ and bias current source $I_3$. Bias current source $I_5$ and resistor $R_4$ develop the reference voltage ($V_R$). Diode-connected transistor $Q_6$ replicates the voltage level shifting introduced by emitter-follower transistor $Q_5$. Transistors $Q_5$–$Q_8$ and bias current source $I_4$ form a differential current-steering amplifier. The amplifier steers current to an output current mirror consisting of MOS transistors $P_1$ and $P_2$. The output of the current mirror drives the bias voltage generator consisting of transistors $Q_9$–$Q_{10}$ and resistors R5–R6. The bias generator scales the current through transistor $Q_9$ to transistors $Q_1$ and $Q_2$. Note that adding resistors between the emitters of transistors $Q_1$, $Q_2$, and $Q_9$ and ground improves matching and reduces the gain of the feedback loop.

The feedback loop operates as follows. At start-up, the filtered clamp voltage ($V_F$) is at the positive supply voltage ($V_+$). This is slightly higher than the reference voltage ($V_R$) and therefore steers slightly more current through transistor $Q_8$, the MOS current mirror, and the bias generator. This in turn biases transistors $Q_1$ and $Q_2$, jump starting the oscillator. The feedback loop provides negative feedback to minimize the difference between the filtered clamp voltage ($V_F$) and the reference voltage ($V_R$) by steering more or less current through the bias generator which sets the operating currents for transistors $Q_1$ and $Q_2$.

When $V_F \approx V_R$, approximately one-half of the bias current $I_4$ flows to the current mirror. When $V_F < V_R$ (indicating transistors $Q_3$ and $Q_4$ are clamping the output amplitude of the oscillator), less current is directed to the current mirror. The output of this amplifier is passed to a bias circuit (transistors $Q_9$ and $Q_{10}$, plus resistors $R_5$ and $R_6$), which sets the appropriate operating current for transistors $Q_1$ and $Q_2$. Capacitors $C_5$–$C_7$ provide filtering and improve stability.

The present invention includes an oscillator circuit with feedback to accurately control the circuit's output amplitude. The embodiments described above are illustrative of the present invention and are not intended to limit the scope of the invention to the particular embodiments described. Accordingly, while one or more embodiments of the invention have been illustrated and described, it will be appreciated that various changes can be made to the embodiments without departing from their spirit or essential characteristics. Therefore, the disclosures and descriptions herein are intended to be are illustrative, but not limiting, of the scope of the invention which is set forth in the following claims.

What is claimed is:

1. A feedback loop for use with a differential direct-coupled oscillator circuit to control the amplitude of an oscillator output signal, the feedback loop comprising:

a pair of clamping transistors, wherein base terminals of the clamping transistors are coupled to an adjustable voltage signal to prevent saturation of the oscillator circuit;

a filter to monitor the current flowing through the clamping transistors;

an amplifier to compare an output of the clamping transistors to a reference signal; and a reference generator to set an operating bias for the direct-coupled oscillator.

2. The feedback loop of claim 1, wherein the filter comprises a resistor and a capacitor coupled between the clamping transistors and a supply voltage.

3. A feedback circuit for use with a differential direct-coupled oscillator circuit to control the amplitude of an oscillator output signal, the feedback loop comprising:

a detector circuit having a detector input coupled to the oscillator circuit and a detector output;

a current amplifier circuit having a first amplifier input coupled to the detector output, and having an amplifier output; and a bias generator having a bias input coupled to the amplifier output and a bias output coupled to the oscillator circuit.

4. The feedback circuit of claim 3, further comprising a reference generator having a reference output coupled to a second amplifier input.

5. The feedback circuit of claim 4, wherein the detector circuit comprises a pair of clamping transistors.

6. The feedback circuit of claim 5, wherein the detector circuit further comprises a filter coupled to the pair of clamping transistors.

7. The feedback circuit of claim 6, further comprising a buffer circuit coupled between the detector output and the first amplifier input.

8. A method for controlling the output amplitude of a differential direct-coupled oscillator, the method comprising steps of:

clamping a low peak of an output signal of the oscillator;

monitoring a clamping current;

converting the clamping current to a filtered voltage;

comparing the filtered voltage to a reference voltage to produce a difference voltage; and setting a bias current in the oscillator using the difference voltage.

9. The method of claim 8, wherein the step of clamping comprises a step of clamping a low peak of an output signal of the oscillator using a pair of claiming transistors.

* * * * *